(12) United States Patent
Yu

(10) Patent No.: US 6,368,947 B1
(45) Date of Patent: Apr. 9, 2002

(54) PROCESS UTILIZING A CAP LAYER OPTIMIZED TO REDUCE GATE LINE OVER-MELT

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/597,098

(22) Filed: Jun. 20, 2000

(51) Int. Cl.[7] .............................................. H01L 21/425
(52) U.S. Cl. ........................ 438/530; 438/514; 438/527; 438/151
(58) Field of Search ................................ 438/514, 527, 438/529, 530, 532, 299, 301, 303, 307

(56) References Cited

U.S. PATENT DOCUMENTS

| | | |
|---|---|---|
| 4,683,645 A | 8/1987 | Naguib et al. |
| 4,745,082 A | 5/1988 | Kwok |
| 4,784,718 A | 11/1988 | Mitani et al. |
| 5,017,504 A | 5/1991 | Nishimura et al. |
| 5,264,382 A | 11/1993 | Watanabe |
| 5,270,232 A | 12/1993 | Kimura et al. |
| 5,374,575 A | 12/1994 | Kim et al. |
| 5,391,510 A | 2/1995 | Hsu et al. |
| 5,393,685 A | 2/1995 | Yoo et al. |
| 5,429,956 A | 7/1995 | Shell et al. |
| 5,434,093 A | 7/1995 | Chau et al. |
| 5,538,913 A | 7/1996 | Hong |
| 5,576,227 A | 11/1996 | Hsu |
| 5,593,907 A | 1/1997 | Anjum et al. |
| 5,607,884 A | 3/1997 | Byun |
| 5,675,159 A | 10/1997 | Oku et al. |
| 5,716,861 A | 2/1998 | Moslehi |
| 5,736,435 A | 4/1998 | Venkatesan et al. |
| 5,793,090 A | 8/1998 | Gardner et al. |
| 5,801,075 A | 9/1998 | Gardner et al. |
| 5,811,323 A | 9/1998 | Miyasaka et al. |
| 5,814,544 A | 9/1998 | Huang |
| 5,817,558 A | 10/1998 | Wu |
| 5,824,586 A | 10/1998 | Wollesen et al. |
| 5,825,066 A | 10/1998 | Buynoski |
| 5,856,225 A | 1/1999 | Lee et al. |

(List continued on next page.)

FOREIGN PATENT DOCUMENTS

| | | |
|---|---|---|
| JP | 3-248433 | 11/1991 |
| JP | 4-123439 | 4/1992 |
| JP | 5/160396 | 6/1993 |

OTHER PUBLICATIONS

Chatterjee, A., et al. "Sub–100nm Gate Length Metal gate NMOS Transistors Fabricated by a Replacement Gate Process", International Electronics Devices Meeting, 1997 IEEE.

Yu, Bin, et al. "Ultra–Thin–Body Silicon–On–Insulator MOSFET's for Terabit–Scale Integration", Department of Electrical Engineering & Computer Sciences, University of California, Berkeley.

Huang, Xuejue, "sub 50–nm FinFET:PMOS" Department of Electrical Engineering & Computer Sciences, University of California, Berkeley, 1999 IEEE.

*Primary Examiner*—Richard Elms
*Assistant Examiner*—Beth E. Owens
(74) *Attorney, Agent, or Firm*—Foley & Lardner

(57) ABSTRACT

A method of fabricating an integrated circuit with ultra-shallow source/drain junctions utilizes a dual amorphization technique. The technique creates a shallow amorphous region and a deep amorphous region 300 nm thick. The shallow amorphous region can be between 10–40 nm below the top surface of the substrate, and the deep amorphous region can be between 150–200 nm below the top surface of the substrate. The process can reduce gate over-melting effects. The process can be utilized for P-channel or N-channel metal oxide semiconductor field effect transistors (MOSFETs).

20 Claims, 6 Drawing Sheets

U.S. PATENT DOCUMENTS

| | | |
|---|---|---|
| 5,858,843 A | 1/1999 | Doyle et al. |
| 5,885,886 A * | 3/1999 | Lee .......................... 438/528 |
| 5,904,530 A | 5/1999 | Shin |
| 5,915,180 A | 6/1999 | Hara et al. |
| 5,915,183 A | 6/1999 | Gambino et al. |
| 5,937,297 A | 8/1999 | Peidous |
| 5,953,602 A | 9/1999 | Oh et al. |
| 5,972,754 A | 10/1999 | Ni et al. |
| 5,998,288 A | 12/1999 | Gardner et al. |
| 6,037,640 A * | 3/2000 | Lee .......................... 257/408 |
| 6,100,171 A * | 8/2000 | Ishida ....................... 438/535 |
| 6,136,616 A * | 10/2000 | Fulford et al. ............. 438/14 |

* cited by examiner

PROCESS UTILIZING A CAP LAYER OPTIMIZED TO REDUCE GATE LINE OVER-MELT

CROSS REFERENCE TO RELATED APPLICATIONS

This patent application is related to U.S. application Ser. No. 09/187,890, now issued as U.S. Pat. No. 6,200,869, by Yu et al., entitled "A Method of Fabricating an Integrated Circuit with Ultra-Shallow Drain/Source Extensions", U.S. application Ser. No. 09/187,635, now issued as U.S. Pat. No. 5,985,726, by Yu et al., entitled "A Damascene Process for Forming Ultra-Shallow Source/Drain Extensions in ULSI MOSFET", U.S. application Ser. No. 09/187,630, now issued by U.S. Pat. No. 6,180,476, by Yu, entitled "Dual Amorphization Process for Ultra-Shallow Drain and Source Extensions", and U.S. application Ser. No. 09/187,172, by Yu, entitled "Recessed Channel Structure for Manufacturing Shallow Source/Drain Extensions", all filed on Nov. 6, 1998 and assigned to the assignee of the present invention. The present application is also related to U.S. application Ser. No. 09/255,203 entitled "Step Drain and Source Junction Formation" by Yu, filed Feb. 22, 1999, U.S. application Ser. No. 09/255,546, entitled "A Locally Confined Deep Pocket Process for ULSI MOSFETS", by Yu, filed on Feb. 22, 1999 and assigned to the assignee of the present invention. The present application is also related to U.S. application Ser. No. 09/597,623, filed on an even date herewith by Yu, entitled, "Dual Amorphization Process Optimized to Reduce Gate Line Over-Melt," assigned to the Assignee of the present application.

FIELD OF THE INVENTION

The present invention relates to integrated circuits and to methods of manufacturing integrated circuits. More particularly, the present invention relates to a method of manufacturing integrated circuits with reduced gate over-melting during annealing.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and draininduced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions (less than 30 or 40 nanometer (nm) junction depth). Forming source and drain extensions with junction depths of less than 30 nm is very difficult using conventional fabrication techniques. Conventional ion implantation and diffusion doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

As MOSFET scaling continues (e.g., MOSFETs become smaller), ultra-shallow and highly-activated junctions are essential for optimum device performance. The lateral abruptness of source and drain extensions is critical for controlling short-channel effects in sub-100 nanometer CMOS transistors. Yet, external resistances (S/D extension, contact resistance, etc.) play a significant role in device performance. Super doped extensions (SDE) rather than the conventional lightly doped drain (LDD) or highly doped drain (HDD) may be required to adequately reduce external resistances. Industry demands may require source and drain extensions shallower than 30 nm for sub-70 nanometer CMOS processes and active dopant concentrations over $10^{21}$ dopants per centimeter cubed. Highly-activated junctions generally require large thermal budgets (high temperatures) while shallow junction formation requires low thermal budgets due to the adverse effects of thermal diffusion.

Recent advancements in low keV implantation of dopants has increased the challenge of providing sufficient dopant electrical activation. Current rapid thermal annealing processes (RTA) can cause undesired thermal diffusion and yet not provide sufficient electrical activation. The electrical activation can be limited by the solid solubility of the material that is doped. Accordingly, novel processes for activating dopants which do not affect the lateral abruptness of junction regions must be developed.

Thus, there is a need for a method of manufacturing ultra-shallow source and drain extensions with sufficient dopant activation. Further still, there is a need for transistors that have ultra-shallow junction source and drain extensions with aggressive scaling of lateral abruptness. Even further still, there is a need for an efficient method of manufacturing source and drain extensions that maximizes dopant activation ion implantation and minimizes short channel effects. Yet further, there is a need for a dual amorphization process that does not over-melt gate conductors.

SUMMARY OF THE INVENTION

An exemplary embodiment relates to a method of manufacturing an integrated circuit. The method includes forming at least a portion of a gate structure, providing a first or pre-amorphization implant, doping the substrate for drain and source extensions, providing oxide spacers, providing a second or post-post-amorphization implant, doping the substrate to form deep source and drain regions, and thermally annealing the substrate. The gate structure includes a polysilicon gate conductor and a cap layer. The gate structure is disposed on a top surface of a silicon substrate. The pre-amorphization implant creates a first amorphous region near the top surface of the substrate. The oxide spacers abut the gate conductor. The post-amorphization implant creates a deep amorphous region in the substrate. Thermally annealing the substrate melts the first amorphous region, the second amorphous region and a portion of the gate conductor.

Another exemplary embodiment relates to a method of providing ultra-shallow drain/source extensions for field effect transistors associated with an ultra-large scale integrated circuit. The method includes forming gate structures on a top surface of a silicon substrate, providing a first amorphization implant, doping the substrate for the drain/source extensions, providing spacers, providing a second amorphization implant, doping the substrate to form source and drain regions, providing an insulative layer above the gate structures, and thermally annealing the substrate. The gate structures include capped gate conductors. The first amorphization implant creates a first amorphous semiconductor region near the top surface of the substrate, and the second amorphization implant creates a deep amorphous semiconductor region in the substrate. The spacers abut the gate structures. The substrate is thermally annealed to form the ultra-shallow drain/source extensions. The thermally annealing step melts the first amorphous semiconductor region, the deep amorphous semiconductor region and a portion of the gate conductor.

Yet another exemplary embodiment relates to a method of manufacturing an ultra-large scale integrated circuit including a plurality of field effect transistors having shallow source and drain extensions. The method comprises steps of forming at least part of a gate structure including a gate conductor on a top surface of a semiconductor substrate, providing a shallow amorphization implant, doping the substrate, providing spacers, providing a deep amorphization implant, doping the substrate to form source and drain regions, providing an insulative layer over the gate structures, and laser annealing the substrate. The gate structure includes a gate conductor. The shallow amorphization implant creates a shallow amorphous region near the top surface, and the deep amorphization implant creates a deep amorphous region in the substrate. The spacers abut the gate structure. Laser annealing the substrate melts the shallow amorphous regions, the deep amorphous region, and a portion of the gate conductor. The source and drain extensions have a thickness of less than 30 nm.

BRIEF DESCRIPTION OF THE DRAWINGS

Exemplary embodiments are described below with reference to the accompanying drawings, wherein like numerals denote like elements.

DETAILED DESCRIPTION OF THE PREFERRED EXEMPLARY EMBODIMENTS

Figure 1:
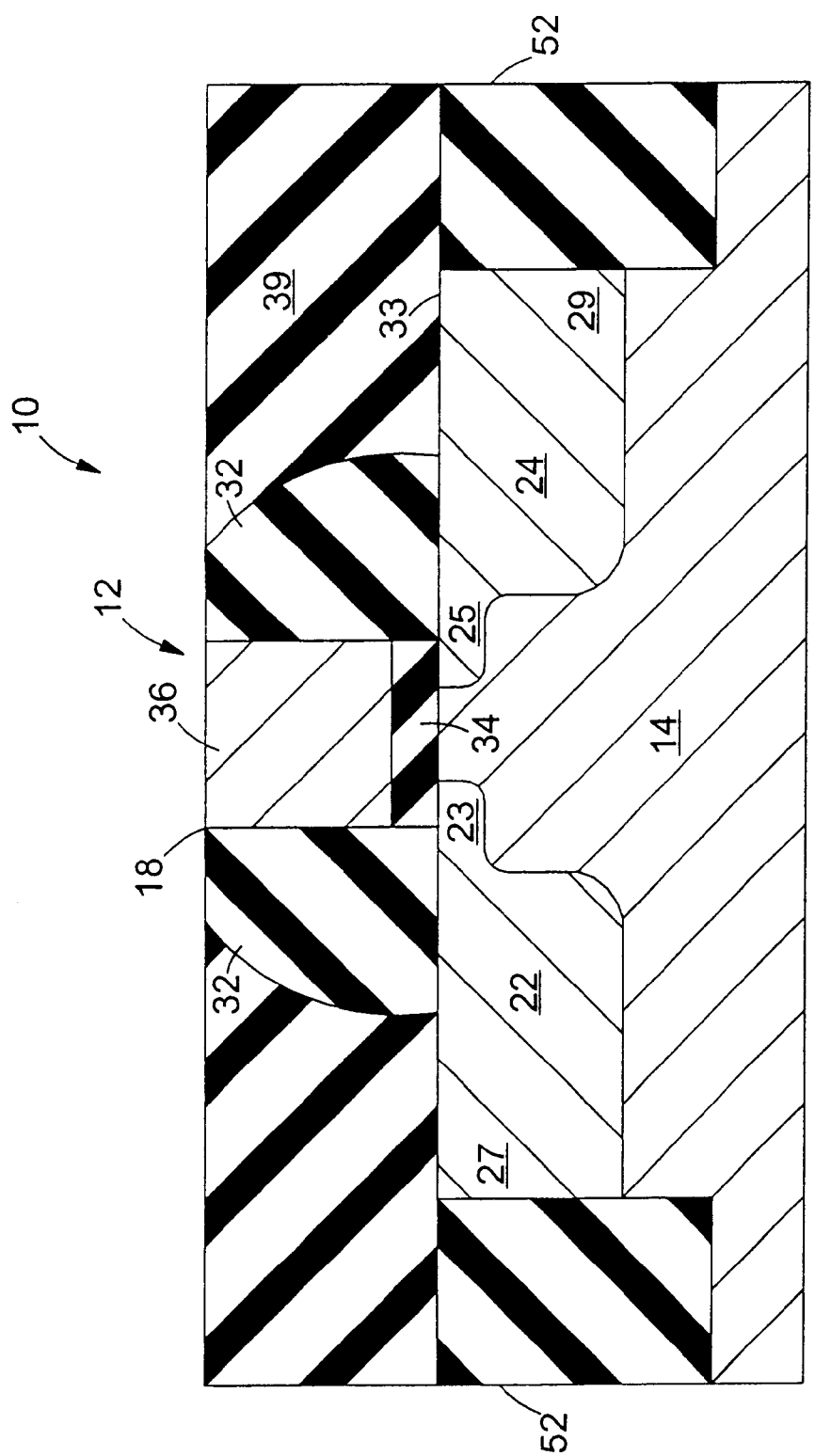
FIG. 1 is a cross-sectional view of a portion of an integrated circuit having a transistor with shallow source/drain extensions in accordance with an exemplary embodiment of the present invention.

With reference to FIG. 1, a portion 10 includes a transistor 12 that is disposed on a semiconductor substrate 14, such as, a single crystal silicon wafer. Transistor 12 is part of an integrated circuit (IC) manufactured on a wafer (such as, a silicon wafer). Transistor 12 includes a gate structure 18, a source region 22, and a drain region 24. Source region 22 includes a deep source region 27 and a source extension 23, and drain region 24 includes a deep drain region 29 and a drain extension 25.

Extensions 23 and 25 are preferably ultra-shallow extensions (e.g., junction depth less than 30–40 nanometers (nm)), which are thinner than regions 22 and 24. Extensions 23 and 25 are connected to regions 22 and 24, respectively, and are disposed partially underneath a gate oxide 34. Ultra-shallow extensions 23 and 25 help transistor 12 achieve substantial immunity to short-channel effects. Short-channel effects can degrade the performance of transistor 12 as well as the manufacturability of the IC associated with transistor 12.

Regions 22 and 24, including regions 27 and 29 and extensions 23 and 25, can have a concentration of $10^{19}$ to $10^{21}$ or more dopants per cubic centimeter. Preferably, the dopants are well-activated, and regions 22 and 24 have a concentration of active dopants over $10^{21}$ dopants per cubic centimeter. An appropriate dopant for a P-channel transistor is boron, boron difluoride, or iridium, and an appropriate dopant for an N-type transistor is arsenic, phosphorous, or antimony.

Transistor 12 can be an N-channel or a P-channel field effect transistor, such as, a metal oxide semiconductor field effect transistor (MOSFET). Transistor 12 is preferably disposed in an active region of substrate 14 and is part of an ultra-large scale integrated (ULSI) circuit that includes one million or more transistors. The various active regions are separated by isolation structures such as structures 52. Structures 52 can be local oxidation of silicon structures or trench isolation structures. Structures 52 preferably include a silicon dioxide material.

Gate structure 18 includes spacers 32, gate oxide 34, and a polysilicon gate conductor 36. Gate conductor 36 can also be a refractory metal. Spacers 32 are preferably an oxide material. Gate oxide 34 is preferably thermally grown on substrate 14 as a silicon dioxide layer.

Spacers 32 and conductor 36 are preferably deposited by chemical vapor deposition (CVD) and etched to form the particular structures for transistor 12. Conductor 36 is preferably deposited as undoped or doped polysilicon which is 1000–1500 Å thick (height) and 50–150 nm wide (left to right). Conductor 36 generally traverses top surface 33 of substrate 14. Conductor 36 can cross over isolation structures such as structures 52 of transistor 12 and other transistors on the integrated circuit.

Spacers 32 are preferably 1000–1500 Å thick (height) and 600–1000 Å wide. Spacers 32 are preferably silicon dioxide spacers. Gate oxide 34 can be a 28 nm thick thermally grown silicon dioxide layer.

A top surface 33 of substrate 14 is covered by an insulative layer 39. Layer 39 is preferably a transparent insulative layer. Layer 39 can be a 1000–1500 Å thick silicon dioxide layer which is deposited in a tetraethylorthosilicate (TEOS) process and planarized.

Figure 2:
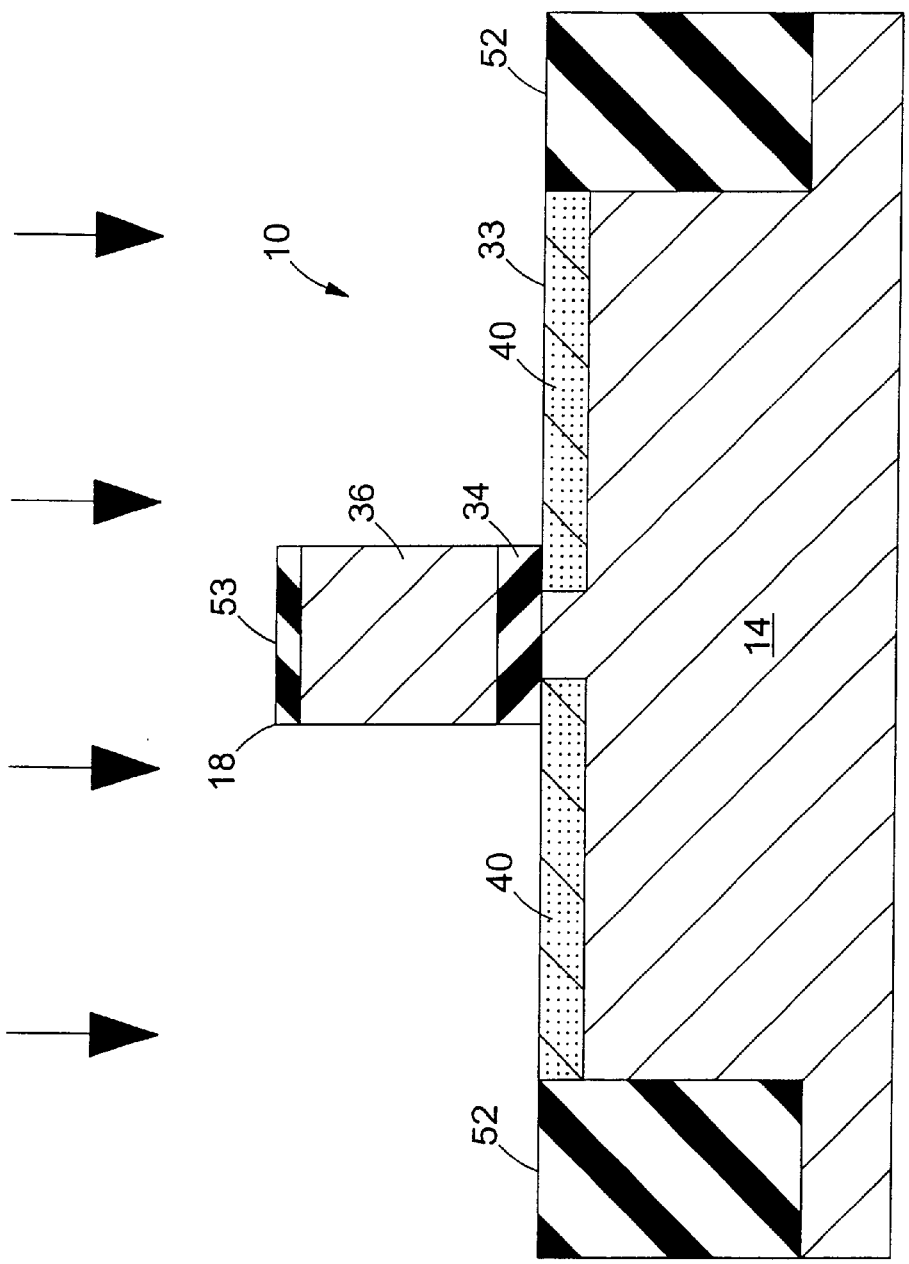
FIG. 2 is a cross-sectional view of the portion of the integrated circuit illustrated in FIG. 1, showing gate stack formation, pre-amorphization implant and dopant implant steps.

With reference to FIGS. 1–6, the fabrication of transistor 12, including source extension 23 and drain extension 25, is described as follows. In FIG. 2, transistor 12 can be substantially formed by conventional semiconductor processing techniques to include gate structure 18, which includes gate oxide 34 and gate conductor 36. Oxide 34 can be thermally grown and gate conductor 36 can be deposited. Shallow trench isolation structures 52 are provided in substrate 14 and define the active region for transistor 12 therebetween.

Structure 18 preferably includes a cap layer 53, such as, a 300 angstrom–400 angstrom thick cap material above conductor 36. Cap layer 53 can be a silicon oxynitride (SiON) material or other material that protects conductor 36 during subsequent processing steps. Cap layer 53 can be deposited by chemical vapor deposition (CVD) and selectively etched. Alternatively, other barrier materials and deposition techniques can be utilized to protect conductor 36. Cap layer 53 is preferably stripped after amorphization processes are completed as discussed below with reference to FIG. 6.

In FIG. 2, portion 10 and substrate 14 are subjected to a shallow pre-amorphization implant (PAI) to form implant regions 40. Implant regions 40 are preferably amorphous material provided between 10–40 nm below top surface 33 of substrate 14. Regions 40 can be created by subjecting substrate 14 to an ion implantation technique.

The ion implantation technique can charge semiconductor ions, such as, silicon or germanium ions, to approximately 10–100 kiloelectron volts (keVs) and implant them into substrate 14. Ion implantation can be performed by implantation devices manufactured by companies, such as, Varian Company of Palo Alto, Calif., Genius Company, and Applied Materials, Inc. The silicon and germanium ions change the single crystal silicon associated with substrate 14 into amorphous material at region 40. The amorphous material associated with region 40 is represented by a stippled area in the figures.

Preferably, germanium ions are used to create regions 40. Germanium ions can be provided at a dose of $10^{16}$ Ge ions per square centimeter. Therefore, regions 40 are preferably an amorphous germanium silicon layer within substrate 14. Regions 40 correspond to extensions 23 and 25 (FIG. 1). Conductor 36 can also be amorphized during this step if not protected by cap layer 53. Angled implants can be utilized to amorphize regions 40 underneath conductor 36.

In FIG. 2, substrate 14 is subjected to a dopant implant. The dopant implant can be arsenic, boron difluoride ($BF_2^+$), indium, phosphorous, or any appropriate dopant for semiconductor fabrication operations. The implant can be performed at a dose of $10^{15}$–$10^{16}$ dopants per square centimeter.

Figure 3:
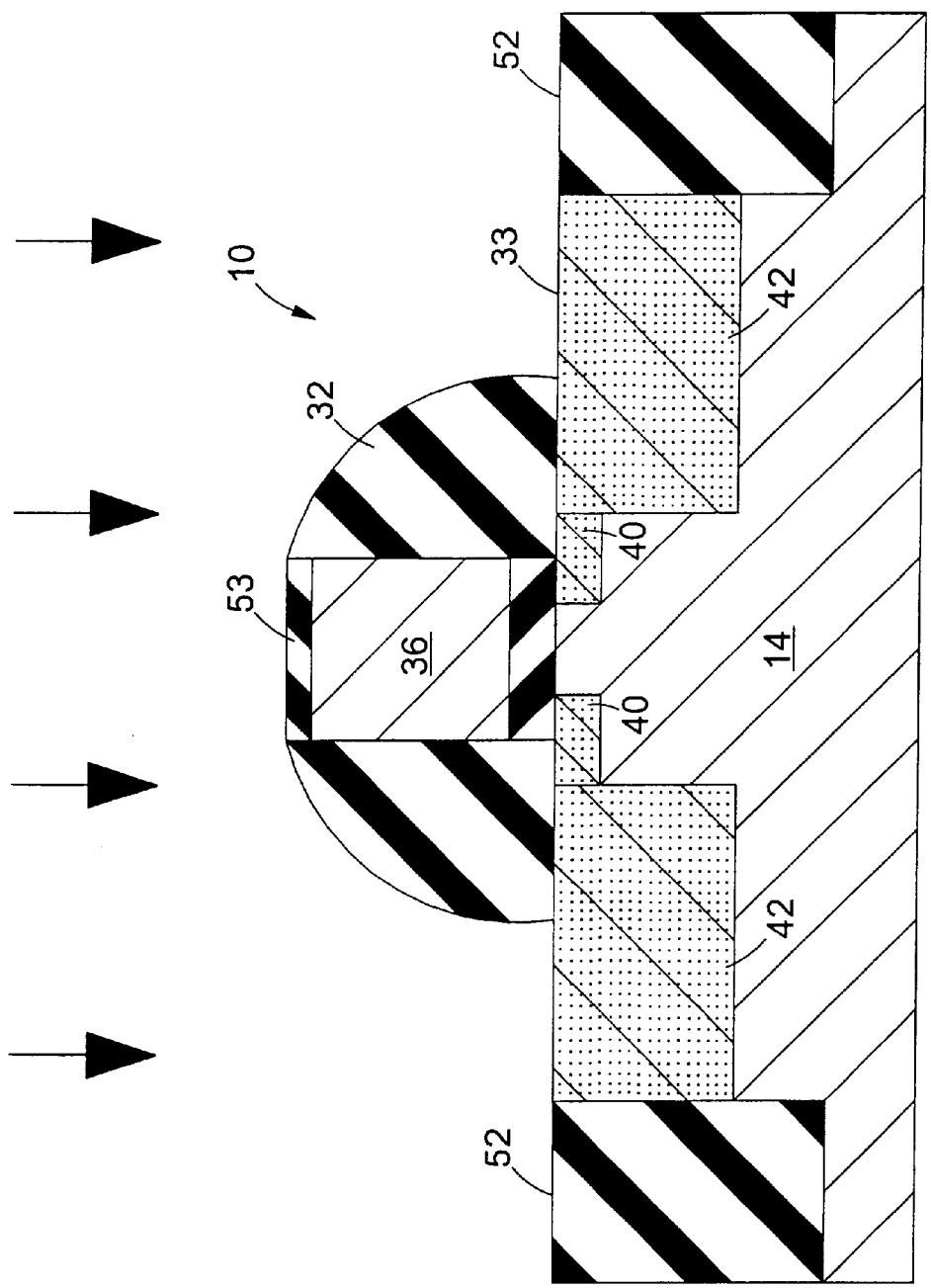
FIG. 3 is a cross-sectional view of the portion of the integrated circuit illustrated in FIG. 1, showing spacer formation, post-amorphization implant and dopant implant steps.

In FIG. 3, spacers 32 are formed by depositing a silicon dioxide layer and then selectively etching to leave spacers 32. After spacers 32 are formed, substrate 14 is subjected to a deep post-amorphization implant to form implant regions 42. Implant regions 42 are preferably amorphous material at a depth of approximately 60–100 nm or deeper. Regions 42 are formed by subjecting substrate 14 to an ion implantation technique, wherein silicon or germanium ions are implanted to a depth between 60–100 nm. Regions 42 are represented as a stippled area in the figures. The implantation technique for forming regions 42 is similar to the technique for forming regions 40, except that the ions used to form regions 42 are more highly charged.

Preferably, germanium ions are used to create region 42. Germanium ions can be provided at a dose of $10^{16}$ germanium ions per square centimeter. Therefore, regions 42 are preferably a deep amorphous silicon germanium layer. Regions 42 correspond to deep source and drain regions 27 and 29. Conductor 36 can also be amorphized during this step if not protected by a cap layer.

Germanium contained in regions 40 and 42 can affect the resistance associated with silicidation of source region 22 and drain region 24. Preferably, germanium levels are controlled so that resistance is not significantly degraded.

After regions 42 are formed, regions 42 are subjected to a source/drain implant. The dopant implant can be arsenic, boron difluoride, iridium, phosphorous or any appropriate dopant for semiconductor fabrication operations. The implant is preferably performed at a dose of $2\times10^{15}$ to $2\times10^{16}$ dopants per square centimeter. Alternatively, regions 42 can be formed before spacers 32 are provided. In this alternative process, substrate 14 is subjected to deep source/drain doping for regions 27 and 29 after spacers 32 are formed.

Figure 4:
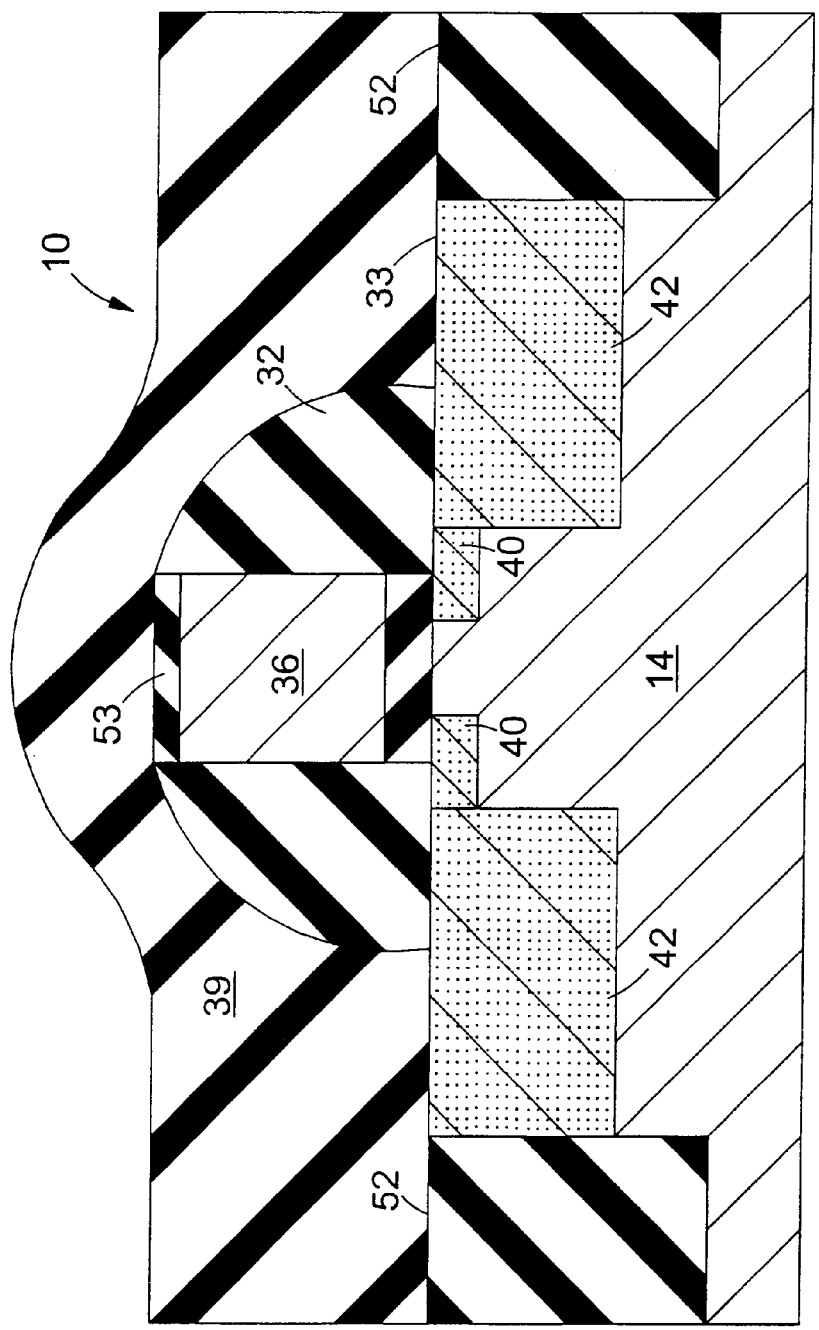
FIG. 4 is a cross-sectional view of the portion of the integrated circuit illustrated in FIG. 1, showing an insulative layer deposition step.

In FIG. 4, top surface 33 of substrate 14 and gate structure 18 is covered by an insulative layer 39. Layer 39 is preferably deposited as a 3000–5000 Å thick silicon dioxide layer in a tetraethylorthosilicate (TEOS) process. Alternatively, other deposition or growth techniques and other materials can be utilized for layer 39. Layer 39 is preferably transparent.

Figure 5:
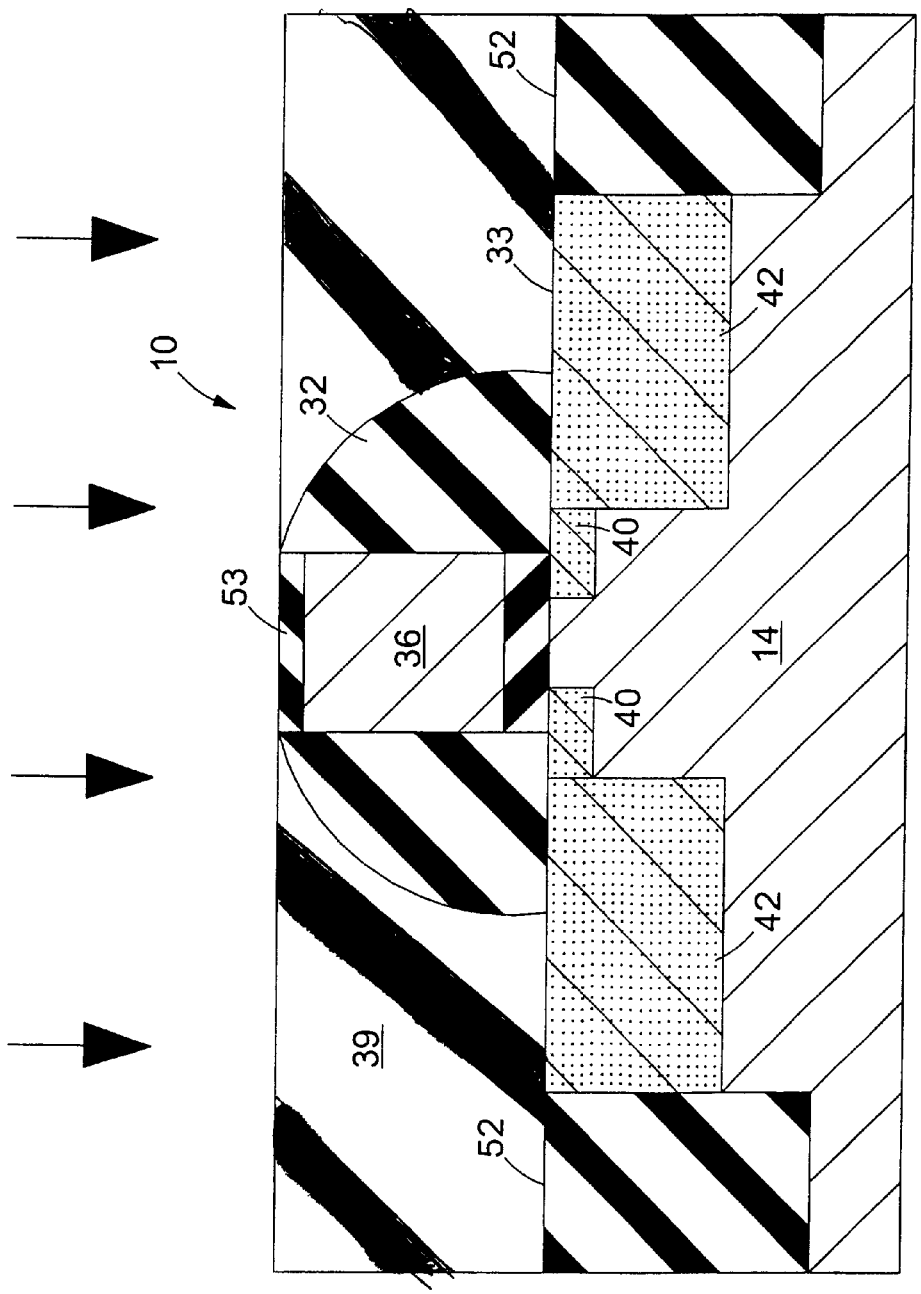
FIG. 5 is a cross-sectional view of the portion of the integrated circuit illustrated in FIG. 1, showing a polishing step.

In FIG. 5, portions of layer 39 are removed until cap layer 53 is exposed. Preferably, a chemical mechanical polish (CMP) can remove portions of the top surface of layer 39 until layer 53 is exposed.

After exposure of layer 53, cap layer 53 can also be removed. Layer 53 can be removed by a CMP technique or an etching technique, such as, a wet etching or dry etching technique. Preferably, layer 39 and conductor 36 have a planarized, relatively continuous top surface after removal of layer 53.

Figure 6:
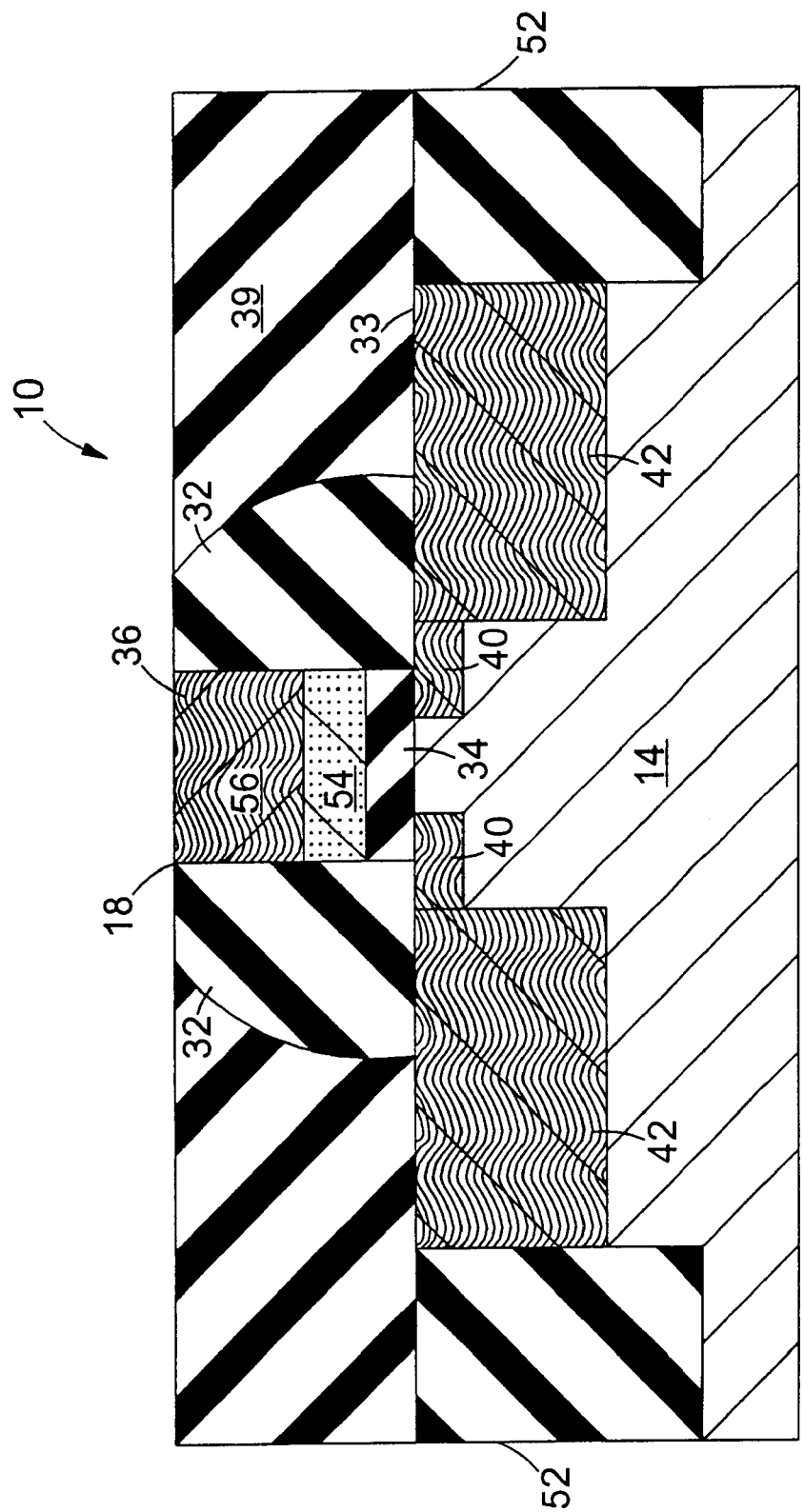
FIG. 6 is a cross-sectional view of the portion of the integrated circuit illustrated in FIG. 1, showing a laser annealing step.

In FIG. 6, portion 10 is exposed to a laser thermal process (LTP). Preferably, the laser thermal process utilizes an excimer laser beam (e.g., a 308 nm wavelength beam). The annealing process preferably melts regions 42 and 40 (as shown by a sinusoidal line in FIG. 6). The process preferably lasts several nanoseconds and uses a laser with light at a 308 nm wavelength. Spacers 32 and layer 39 can be a transparent material, such as, silicon dioxide, so the light from the laser can reach regions 40 and 42. The light through spacers 32 melts regions 40 for extensions 23 and 25 (FIG. 1).

In addition, gate conductor 36 is partially melted (as shown by a sinusoidal line in FIG. 6). Gate conductor 36 includes an unmelted portion 54 and a melted portion 56. Preferably, melted portion 56 is 50–70 percent (e.g., 500 –1,125 Å) of the total original height of gate conductor 36.

Spacers 32 provide a container for holding melted portion 56 of conductor 36 and can reduce gate rounding effects. Preferably, unmelted portion 54 protects gate oxide 34. Portion 56 has a higher melting temperature than regions 40 and 42 because it was not subject to the amorphization implants. Cap layer 53 protects the polycrystalline structure of conductor 36 from the amorphization implants.

After the laser beam is removed, molten regions associated with regions 40 and 42 and portion 56 become recrystallized. The dopant within regions 40 and 42 is well-activated and source and drain regions 22 and 24 are formed including deep regions 27 and 29 and extensions 23 and 25. The high conductivity associated with the well-activated dopants can reduce the need for silicide layers for connecting regions 22 and 24 to other circuit elements.

The laser thermal process has significant advantages over conventional rapid thermal anneal (RTA) processes. For example, the laser thermal process provides almost a zero thermal budget because the laser pulse can be reduced to a few nanoseconds which is approximately 8 orders of magnitude shorter than a conventional rapid thermal anneal process. During this short period of time, thermal diffusion is almost negligible. Another advantage of the annealing process described above is that active dopant concentrations of larger than $10^{21}$ dopants per centimeter cubed are possible because the metastable process is above the dopants' solid solubility limit. In addition, the above described process can be performed locally. Local heating allows specific regions of substrate 14 to be heated so that profiles related to threshold voltages, channel implants and halo implants are not affected.

The advantageous process described in the present application utilizes amorphization techniques to reduce the melting temperatures associated with source 22 and drain 24 (regions 42 and 40). Accordingly, a laser thermal process can be utilized which is sufficient to melt regions 40 and 42 and does not completely melt conductor 36. The melting of conductor 36 can be a problem in conventional processes where conductor 36 passes over oxide structures such as structure 52. The oxide structures do not dissipate heat as well as substrate 14 and can cause gate conductor 36 to overmelt at those locations and can cause gate rounding effects after recrystallization. In addition, the melting of conductor 36 is a particular problem as the width of conductor 36 is decreased. However, since a lower thermal budget process can be utilized with a transistor manufactured by utilizing a dual amorphization process, conuctor 36 is not subjected to an anneal process which can cause overmelting.

With reference to FIG. 1, substrate 14 and gate conductor 36 are recrystallized after melting. After the annealing step, conventional CMOS processes can be utilized to form contacts, insulative layers, interconnections, and other structures for integrated circuit 10.

It is understood that, while preferred embodiments, examples, materials, and values are given, they are for the purpose of illustration only. The apparatus and method of the invention are not limited to the precise details and conditions disclosed. For example, although two fabrication methods utilizing ion implantation are discussed, other dual amorphization techniques and methods could utilize the principles of the present invention to create ultra-shallow source and drain extensions. Thus, changes may be made to the details disclosed without departing from the spirit of the invention, which is defined by the following claims.

What is claimed is:

1. A method of manufacturing an integrated circuit, comprising:

forming at least a portion of a gate structure including a polysilicon gate conductor and a cap layer, the gate structure being disposed on a top surface of a silicon substrate;

providing a first amorphization implant, the first amorphization implant creating a first amorphous region near the top surface of the substrate;

first doping the substrate for drain and source extensions;

providing oxide spacers, the spacers abutting the gate conductor;

providing a second amorphization implant, the second amorphization implant creating a deep, second amorphous region in the substrate;

second doping the substrate to form deep source and drain regions;

removing the cap layer to expose the polysilicon gate conductor; and thermally annealing the substrate to melt the first amorphous region, the second amorphous region and a portion of the gate conductor.

2. The method of claim 1, wherein the deep amorphous region is 150–200 nm below the top surface.

3. The method of claim 2, wherein the first amorphous region is 10–15 nm below the surface.

4. The method of claim 1, further comprising:

providing an insulative layer over the gate structure after the second amorphization implant.

5. A method of manufacturing an integrated circuit, comprising:

forming at least a portion of a gate structure including a polysilicon gate conductor and a cap layer, the gate structure being disposed on a top surface of a silicon substrate;

providing a first amorphization implant, the first amorphization implant creating a first amorphous region near the top surface of the substrate;

first doping the substrate for drain and source extensions;

providing oxide spacers, the spacers abutting the gate conductor;

providing a second amorphization implant, the second amorphization implant creating a deep amorphous region in the substrate;

second doping the substrate to form deep source and drain regions;

providing an insulative layer over the gate structure after the second amorphization implant;

polishing the insulative layer to expose the cap layer; and thermally annealing the substrate to melt the first amorphous region, the second amorphous region and a portion of the gate conductor.

6. The method of claim 5, further comprising:

removing the cap layer before the thermally annealing step.

7. The method of claim 6, wherein the providing the spacers step is performed after the first doping step.

8. The method of claim 1 further comprising:

providing the first amorphization implant before the first doping step.

9. The method of claim 1, wherein the annealing step is a laser annealing step.

10. A method of manufacturing an ultra-large scale integrated circuit including a plurality of field effect transistors having shallow source and drain extensions, the method comprising steps of:

forming at least part of a gate structure including a gate conductor above a top surface of a semiconductor substrate and a cap layer above the gate conductor;

providing a shallow amorphization implant, the shallow amorphization implant creating a shallow amorphous region near the top surface;

first doping the substrate to form the shallow source and drain extensions;

providing spacers, the spacers abutting the gate structures;

providing a deep amorphization implant, the deep amorphization implant creating a deep amorphous region in the substrate;

second doping the substrate to form source and drain regions;

providing an insulative layer over the gate structures;

removing a portion of the insulative layer to expose the cap layer; and laser annealing the substrate to melt the shallow amorphous region, the deep amorphous region and a portion of the gate conductor, thereby forming shallow source and drain extensions having a thickness of less than 30 nm.

11. The method of claim 10, further comprising removing the cap layer above the gate conductor before the laser annealing step.

12. The method of claim 10, wherein the laser annealing is excimer laser annealing.

13. The method of claim 10, wherein the gate conductor includes polysilicon.

14. The method of claim 13, wherein the dopant concentration of the source and drain regions is above $10^{21}$ dopants per cubic centimeter.

15. The method of claim 10, wherein the portion includes between 50 and 66% of the gate conductor.

16. A method of providing a plurality of ultra-shallow drain/source extensions for field effect transistors associated with an ultra-large scale integrated circuit, the method comprising:

forming a plurality of at least a portion of gate structures including capped gate conductors on a top surface of a silicon substrate, the capped gate conductors including a gate conductor layer below a cap layer;

providing a first amorphization implant, the first amorphization implant creating a first amorphous semiconductor region near the top surface of the substrate;

first doping the substrate in the first amorphous semiconductor region for the ultra-shallow drain/source extensions;

providing spacers, the spacers abutting the gate structures;

providing a second amorphization implant, the second amorphization implant creating a deep amorphous semiconductor region in the substrate;

second doping the substrate in the deep amorphous semiconductor region to form source and drain regions;

providing an insulative layer above the capped gate structures;

removing at least a portion of the insulative layer and the cap layer to expose the gate conductor layer; and thermally annealing the substrate to form the ultra shallow drain/source extensions, wherein the thermally annealing step melts the first amorphous semiconductor region, the deep amorphous semiconductor region and a portion of the gate conductor layer.

17. The method of claim 16, wherein the ultra-shallow drain/source extensions have a dopant concentration above $10^{21}$ dopants per cubic centimeter.

18. The method of claim 17, wherein the first amorphous semiconductor region is less than 10–15 nm below the top surface, and the deep amorphous semiconductor region is more than 150–200 nm below the top surface.

19. The method of claim 18, wherein the thermal annealing is performed by laser annealing the substrate.

20. A method of providing a plurality of ultra-shallow drain/source extensions for field effect transistors associated with an ultra-large scale integrated circuit, the method comprising:

forming a plurality of at least a portion of gate structures including capped gate conductors on a top surface of a silicon substrate;

providing a first amorphization implant, the first amorphization implant creating a first amorphous semiconductor region near the top surface of the substrate;

doping the substrate for the drain/source extensions;

providing spacers, the spacers abutting the gate structures;

providing a second amorphization implant, the second amorphization implant creating a deep amorphous semiconductor region in the substrate;

doping the substrate to form source and drain regions;

providing an insulative layer above the gate structures;

removing a portion of the insulative layer to expose the capped gate conductors; and thermally annealing the substrate to form the ultra shallow drain/source extensions, wherein the thermally annealing step melts the first amorphous semiconductor region, the deep amorphous semiconductor region and a portion of the gate conductors.

* * * * *